(12) United States Patent
Lien et al.

(10) Patent No.: US 12,132,456 B2
(45) Date of Patent: *Oct. 29, 2024

(54) NOISE DETECTING CIRCUIT AND ASSOCIATED SYSTEM AND METHOD

(71) Applicant: TAIWAN SEMICONDUCTOR MANUFACTURING COMPANY LTD., Hsinchu (TW)

(72) Inventors: Bei-Shing Lien, Taipei (TW); Jaw-Juinn Horng, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/357,989

(22) Filed: Jul. 24, 2023

(65) Prior Publication Data
US 2023/0370033 A1 Nov. 16, 2023

Related U.S. Application Data

(63) Continuation of application No. 17/936,457, filed on Sep. 29, 2022, now Pat. No. 11,791,784, which is a continuation of application No. 17/070,281, filed on Oct. 14, 2020, now Pat. No. 11,489,502.

(51) Int. Cl.
*H03F 3/21* (2006.01)
*H03F 3/193* (2006.01)
*H03F 3/45* (2006.01)

(52) U.S. Cl.
CPC ......... *H03F 3/45179* (2013.01); *H03F 3/193* (2013.01); *H03F 3/211* (2013.01); *H03F 3/45475* (2013.01); *H03F 2200/171* (2013.01); *H03F 2200/372* (2013.01)

(58) Field of Classification Search
CPC ..................................... H03F 3/21; H03F 3/45
USPC .................................................. 330/310, 260
See application file for complete search history.

(56) References Cited

U.S. PATENT DOCUMENTS

| | | | |
|---|---|---|---|
| 2002/0084782 A1* | 7/2002 | Guthrie | G01R 33/3621 324/307 |
| 2003/0072462 A1* | 4/2003 | Hlibowicki | H04R 3/007 381/96 |
| 2012/0056667 A1* | 3/2012 | Feng | H03K 19/00369 327/551 |

* cited by examiner

*Primary Examiner* — Henry Choe
(74) *Attorney, Agent, or Firm* — WPAT LAW; Anthony King

(57) ABSTRACT

A noise detecting circuit including an amplifier circuit amplifying an input signal indicating a noise level of a circuit to be detected and output an amplified signal; a filtering circuit receiving and filtering the amplified signal and output a filtered signal; and a comparing circuit receiving and compare the filtered signal to a reference voltage and output an output signal; wherein the filtering circuit includes: an output terminal; and a first filter selectively coupled to the output terminal, including: a sub-output terminal; a switch selectively coupling the sub-output terminal to the output terminal; a resistor, wherein a terminal of the resistor is coupled to the amplifier circuit and another terminal of the resistor is coupled to the sub-output terminal; and a capacitor, wherein a terminal of the capacitor is coupled to the sub-output terminal and another terminal of the capacitor is coupled to a reference voltage source.

20 Claims, 13 Drawing Sheets

NOISE DETECTING CIRCUIT AND ASSOCIATED SYSTEM AND METHOD

CROSS-REFERENCE TO RELATED APPLICATION

This application is a continuation of U.S. application Ser. No. 17/936,457, field on Sep. 29 2022, which is a continuation of U.S. application Ser. No. 17/070,281, field on Oct. 14 2020, which application is hereby incorporated herein by reference.

BACKGROUND

In some platforms such like a Wafer Acceptance Test (WAT) platform, the integrated circuit (IC) testing is difficult because the testing equipment limitation or the requirement of some specific devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
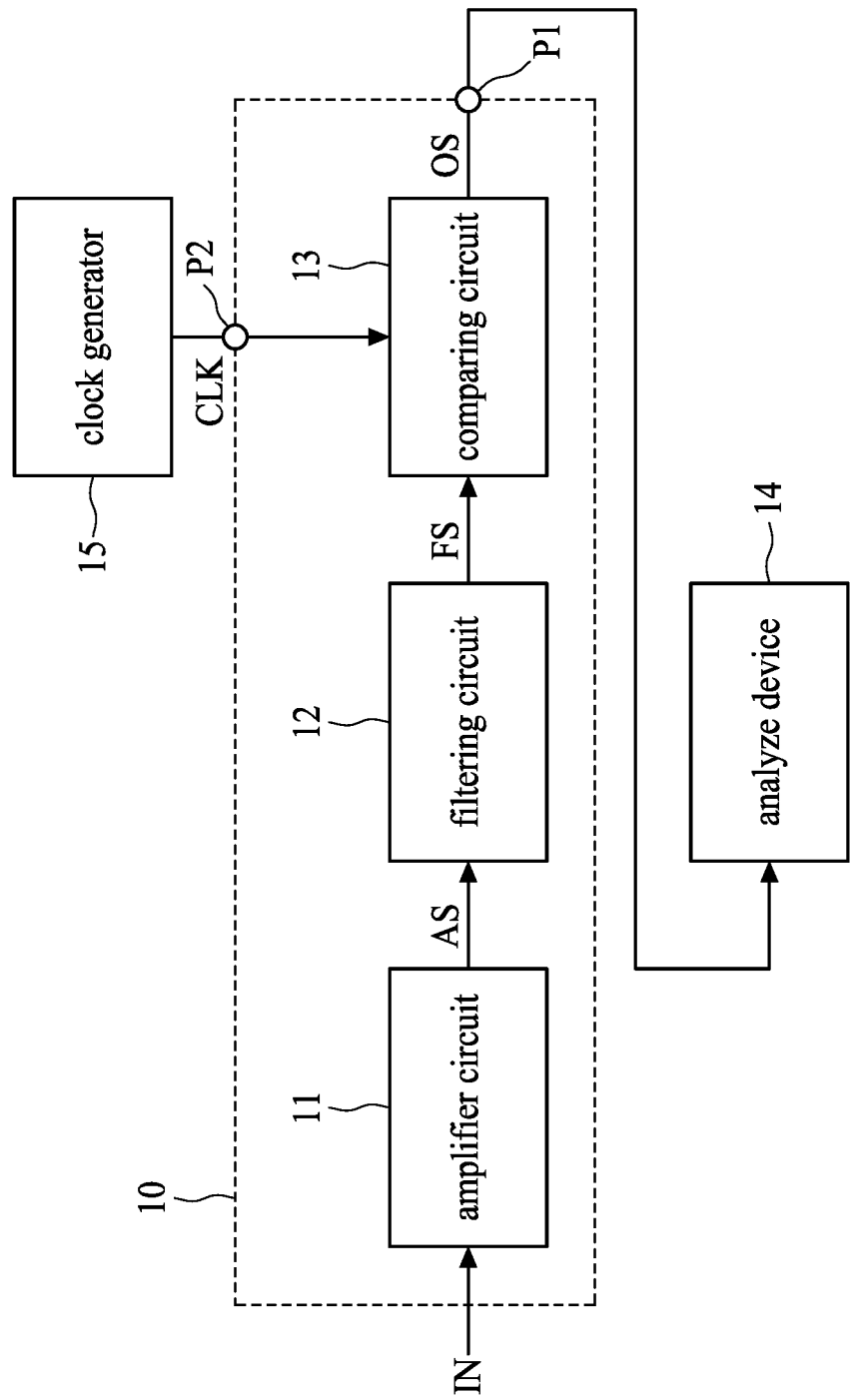
FIG. 1 is a diagram illustrating a noise detecting system in accordance with an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In some scenarios, the integrated circuit (IC) testing is difficult because the testing equipment limitation or the requirement of some specific devices. For example, in a Wafer Acceptance Test (WAT) platform, the frequency of the clock signal is limited to 10 MHz, and using the spectrum analyzer is forbidden. In addition, a specific GSG probe card is required. Therefore, in order to learn the noise level of the circuit/device in the WAT platform, too many obstacles need to be overcome. Accordingly, this present disclosure proposes a noise detecting circuit, a noise detecting system and a noise detecting method to at least solve the aforementioned problem.

FIG. 1 is a diagram illustrating a noise detecting system 1 in accordance with an embodiment of the present disclosure. In some embodiments of the present disclosure, the noise detecting system 1 includes a noise detecting circuit 10 including an amplifier circuit 11, a filtering circuit 12 and a comparing circuit 13. In some embodiments of the present disclosure, a circuit to be detected is coupled to the noise detecting circuit 10, and the noise detecting system 1 is arranged to detect the noise level of the circuit to be detected. In some embodiments of the present disclosure, the noise detecting system 1 is arranged to detect the noise level of an operational transconductance amplifier (OTA) 111 (shown in FIG. 2) of the amplifier circuit 11.

The amplifier circuit 11 receives an input signal IN and outputs an amplified signal AS. In some embodiments of the present disclosure, the amplifier circuit 11 is arranged to output the amplified signal AS by amplifying the input signal IN with a predetermined gain. In some embodiments of the present disclosure, the input signal IN is received from a circuit to be detected which will be discussed later. In some embodiments of the present disclosure, the input signal IN indicates a noise level of the circuit to be detected.

The filtering circuit 12 receives the amplified signal AS and outputs a filtered signal FS. In some embodiments of the present disclosure, the filtering circuit 12 is arranged to output the filtered signal FS by filtering the amplified signal AS with a predetermined corner frequency. The comparing circuit 12 receives the filtered signal FS and outputs an output signal OS. In some embodiments of the present disclosure, the comparing circuit 13 is arranged to output the output signal OS by comparing the filtered signal FS to a reference voltage. In some embodiments of the present disclosure, the output signal OS indicates the noise level of the circuit to be detected.

In some embodiments of the present disclosure, the noise detecting system 1 further includes an analyze device 14 and a clock generator 15. In some embodiments of the present disclosure, the analyze device 14 is coupled to the comparing circuit 13 to receive the output signal OS via an output pad P1. In some embodiments of the present disclosure, the analyze device 14 includes a direct current (DC) meter to generate a CDF in response to the output signal OS and the reference voltage, and derive the noise level of the circuit to be detected or the OTA 111 based on the CDF. In some embodiments of the present disclosure, the clock generator 15 is coupled to a comparator 8 (shown in FIG. 8) of the comparing circuit 13 to provide a clock signal CLK via an output pad P2. In some embodiments of the present disclosure, a frequency of the clock signal CLK is below 10 MHz.

In some embodiments of the present disclosure, the noise detecting circuit 10 is integrated in an integrated circuit (IC). In some embodiments of the present disclosure, the noise detecting circuit 10 is formed on a semiconductor substrate of a wafer. In some embodiments of the present disclosure, the semiconductor substrate includes a plurality of dies which are separated by scribe lines, and the circuit to be detected and the noise detecting circuit 10 are disposed in the scribe line. It should be noted that the noise detecting system 1 may include other essential elements/devices to achieve the basic function. For example, the noise detecting system 1 includes a DC supply device to provide a supply voltage.

Figure 2:
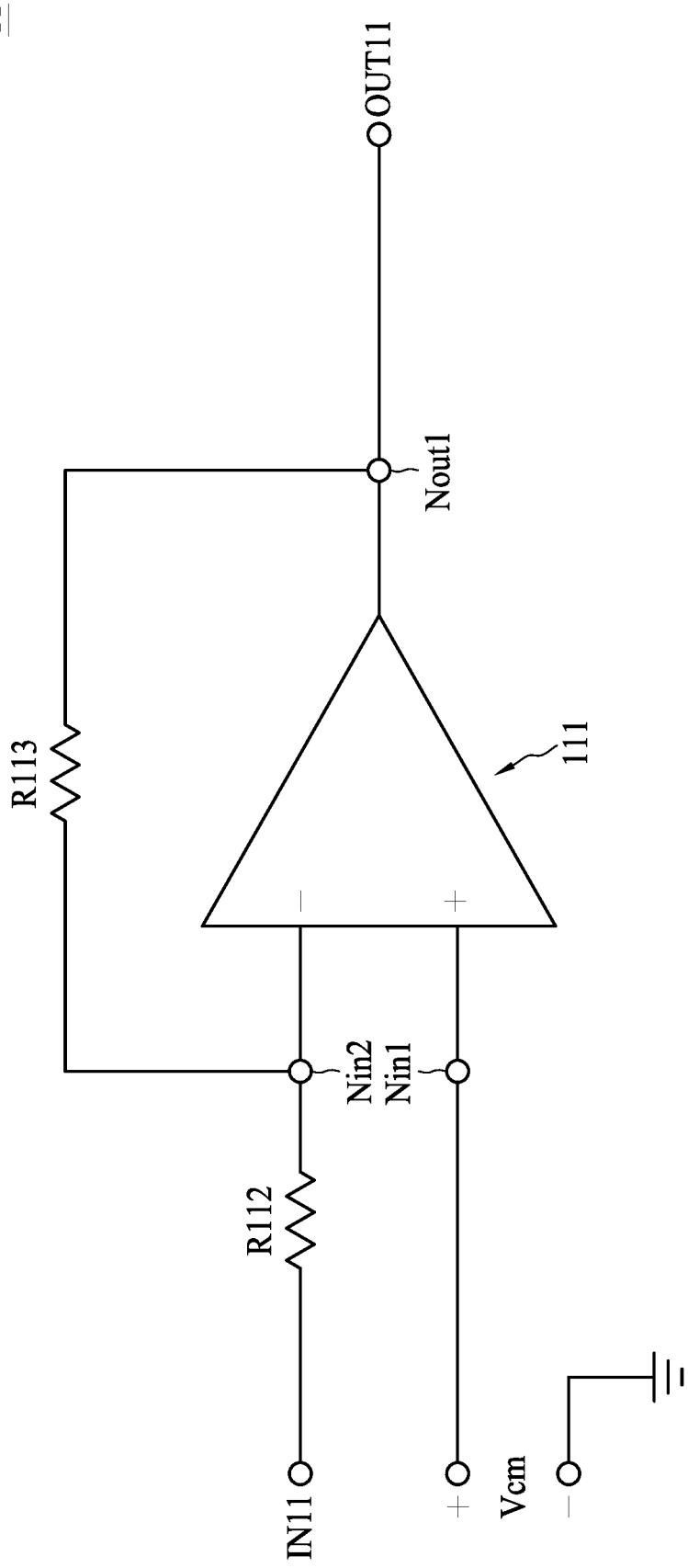
FIG. 2 is a diagram illustrating an amplifier circuit in accordance with an embodiment of the present disclosure.

FIG. 2 is a diagram illustrating the amplifier circuit 11 in accordance with an embodiment of the present disclosure. In some embodiments of the present disclosure, the amplifier circuit 11 includes am input terminal IN11, an output terminal OUT11, the OTA 111, and resistors R112 and R113.

In some embodiments of the present disclosure, the OTA 111 includes input terminals Nin1 and Nin2 and an output terminal Nout1. In some embodiments of the present disclosure, the input terminal Nin1 is a positive input terminal of the OTA 111, and the input terminal Nin2 is a negative input terminal of the OTA 111. In some embodiments of the present disclosure, the input terminal Nin1 is coupled to a common voltage Vcm, and the input terminal Nin2 is coupled to the resistors R112 and R113. In some embodiments of the present disclosure, the output terminal Nout1 is coupled to the output terminal OUT11.

In some embodiments of the present disclosure, the resistor R112 is coupled between the input terminal IN11 and the input terminal Nin2. In some embodiments of the present disclosure, the resistor R113 is coupled between the output terminal OUT11 and the input terminal Nin2. Those skilled in the art should understand that the gain of the amplifier circuit 11 is determined by R113/R112. In some embodiments of the present disclosure, the gain of the amplifier circuit 11 is about 30 dB to 45 dB.

Figure 3:
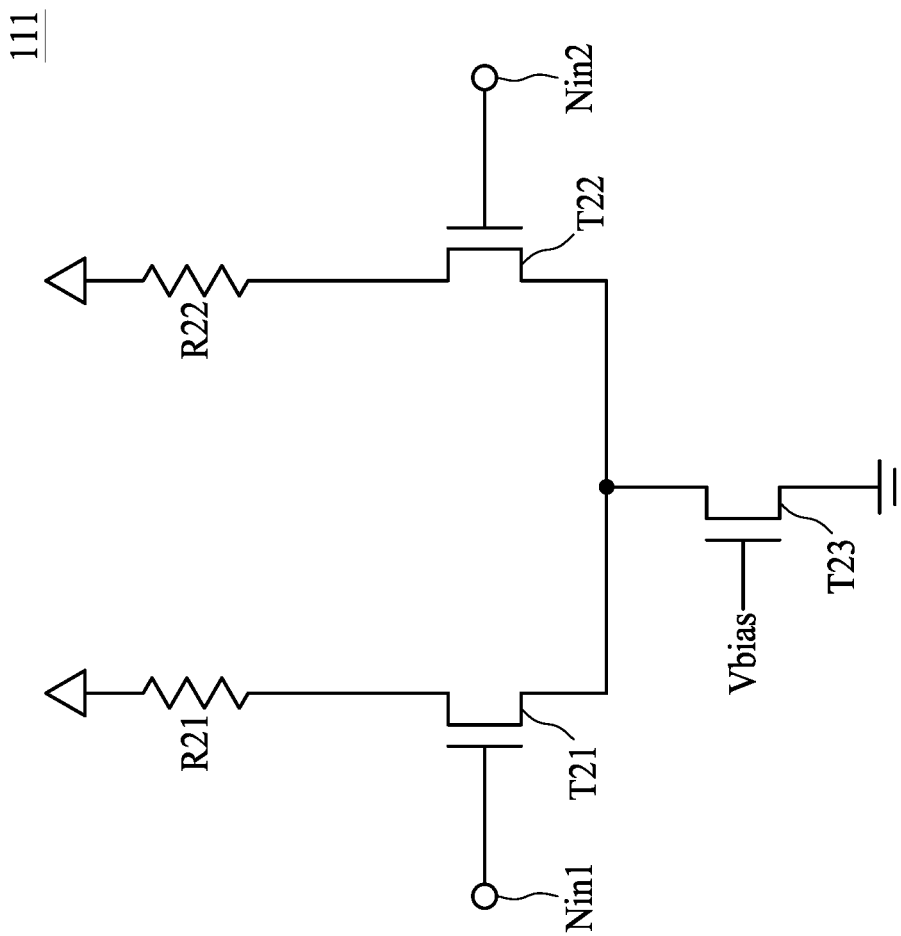
FIG. 3 is a diagram illustrating an OTA in accordance with an embodiment of the present disclosure.

FIG. 3 is a diagram illustrating the OTA 111 in accordance with an embodiment of the present disclosure. In some embodiments of the present disclosure, the OTA 111 includes transistors T21, T22 and T23 and resistors R21 and R22. In some embodiments of the present disclosure, each of the transistors T21, T22 and T23 is implemented by an N-type Metal-Oxide-Semiconductor (NMOS).

In some embodiments of the present disclosure, a gate terminal the transistor T21 is coupled to the input terminal Nin1, a drain terminal of the transistor T21 is couple to the resistor R21, and a source terminal of the transistor T21 is coupled to a drain terminal of the transistor T23. In some embodiments of the present disclosure, a gate terminal the transistor T22 is coupled to the input terminal Nin2, a drain terminal of the transistor T22 is couple to the resistor R22, and a source terminal of the transistor T22 is coupled to the drain terminal of the transistor T23. In some embodiments of the present disclosure, a gate terminal the transistor T23 is arranged to receive a bias voltage Vbias, and a source terminal of the transistor T23 is coupled to the ground. In some embodiments of the present disclosure, the resistors R21 is coupled between a supply voltage and the transistor T21, and the resistor R22 is coupled between the supply voltage and the transistor T22.

The transistors T21 and T22 constitute an input pair, and the transistor T23 is configured to be a current source for providing a current through the transistor T23. However, the OTA 111 shown in FIG. 3 is only for illustrative purpose. Those skilled in the art should understand that the OTA 111 can be implemented by different architecture.

As mentioned above, the noise detecting system 1 proposed by the present disclosure is arranged to at least detect the noise level of the OTA 111 or other circuits coupled to the OTA 111.

Figure 4A:
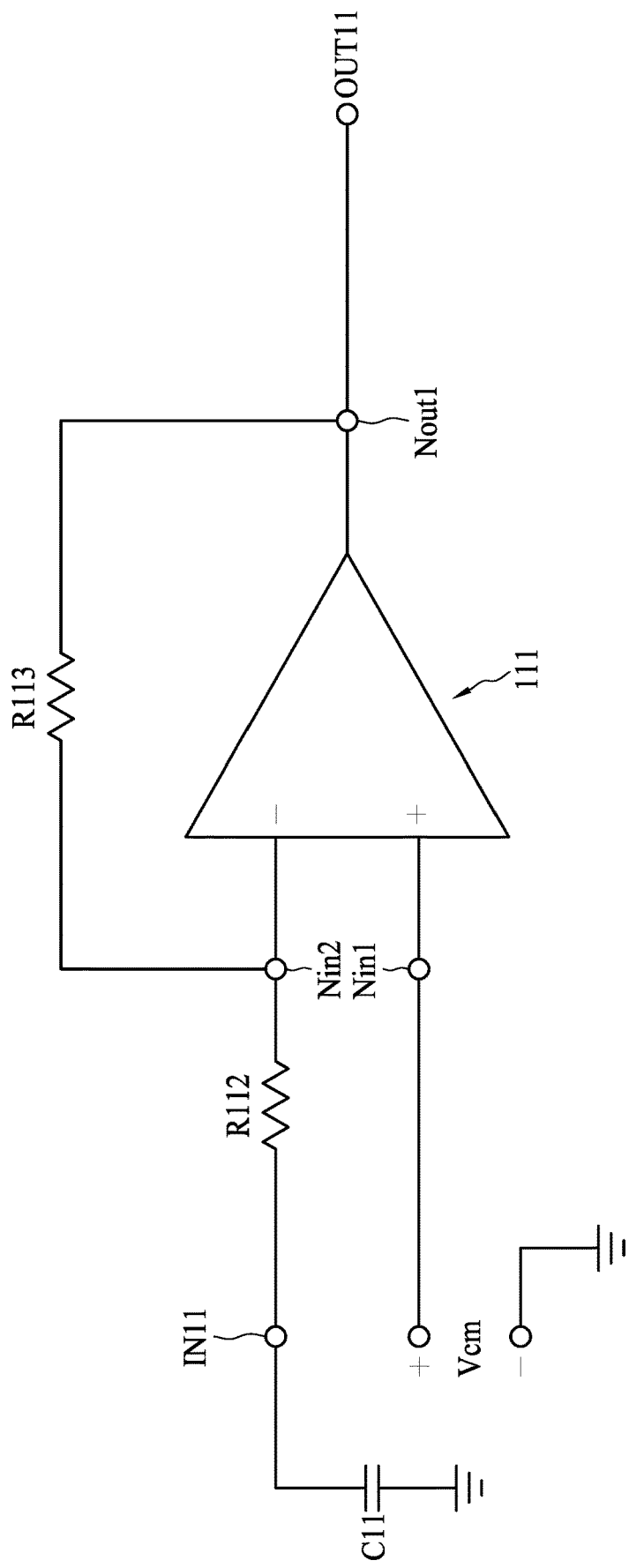
FIGS. 4A and 4B are diagrams illustrating configurations of an amplifier circuit for detecting the noise level of an OTA in accordance with an embodiment of the present disclosure.
Figure 4B:
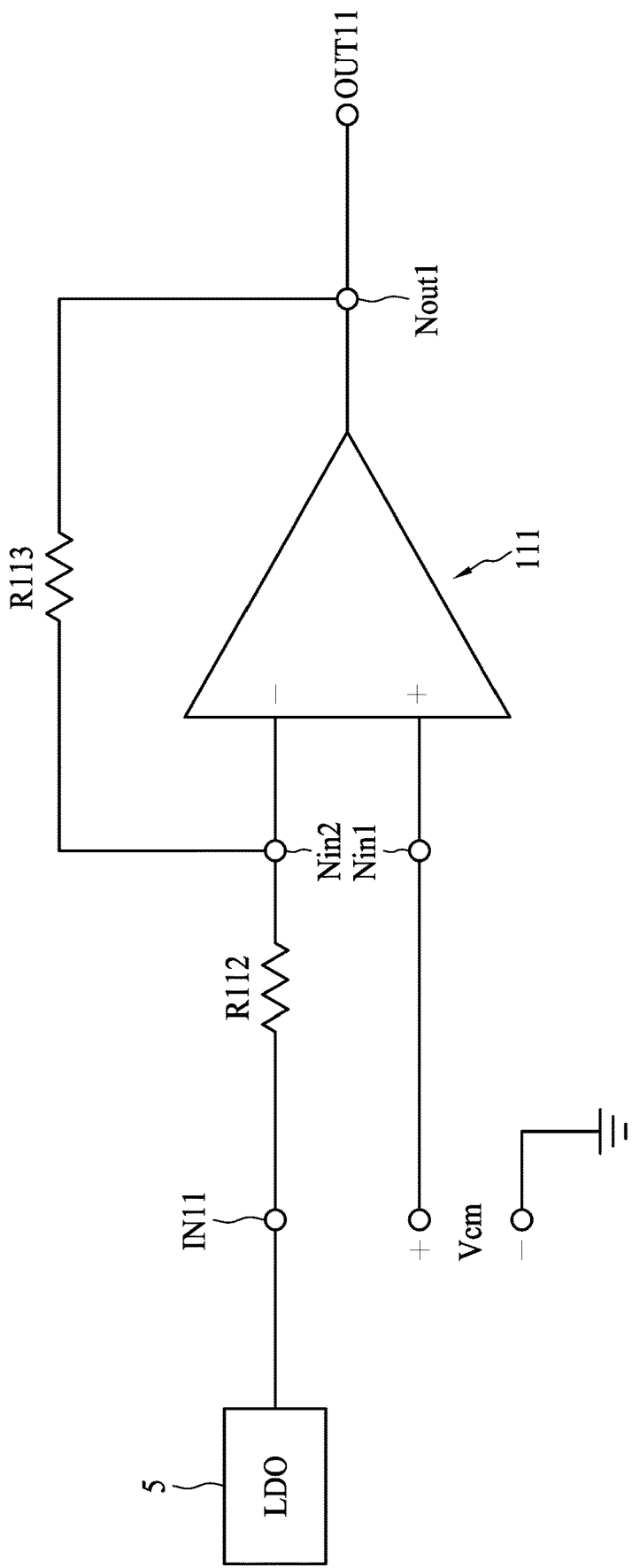

FIGS. 4A and 4B are diagrams illustrating the configurations of the amplifier circuit 11 for detecting the noise level of the OTA 111 in accordance with an embodiment of the present disclosure. As shown in FIG. 4A, for detecting the noise level of the OTA 111, the input terminal IN11 is coupled to a capacitor C11. The capacitor C11 is configured to be a DC block for stabling the alternate current (AC) ground. In some embodiments of the present disclosure, the capacitor C11 can be an actual capacitor. In some embodiments of the present disclosure, the capacitor C11 can be implemented by coupling a Ground-Signal-Ground (GSN) pad to the input terminal IN11. With such configurations, the input signal IN is the noise of the OTA 111, which is mostly from the input pair, and the circuit to be detected is the OTA 111.

As shown in FIG. 4B, for detecting the noise level of the OTA 111, the input terminal IN11 is coupled to a low dropout regulator (LDO) 5. The LDO 5 is configured to be a DC block for stabling the AC ground. With such configurations, the input signal IN is the noise of the OTA 111, which is mostly from the input pair, and the circuit to be detected is the OTA 111.

Figure 5:
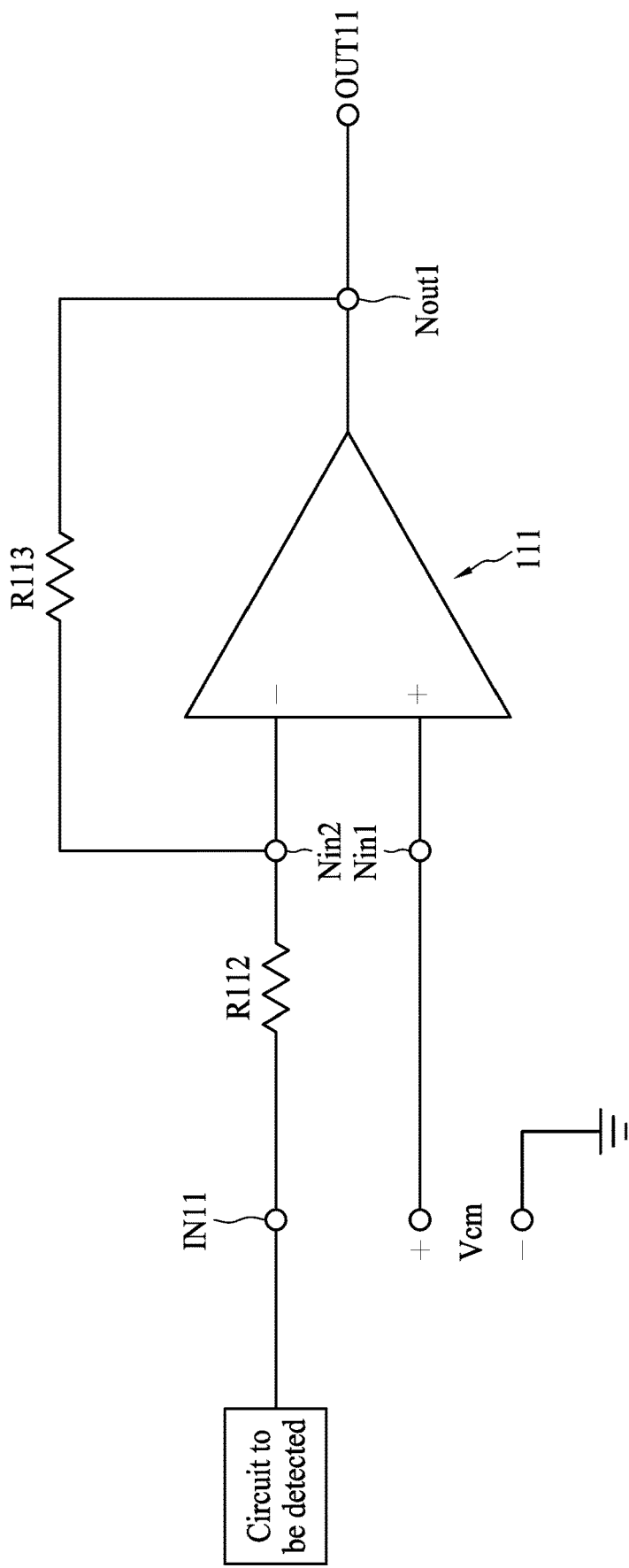
FIG. 5 is a diagram illustrating configurations of an amplifier circuit for detecting the circuit to be detected coupled to the amplifier circuit in accordance with an embodiment of the present disclosure.

FIG. 5 is a diagram illustrating the configurations of the amplifier circuit 11 for detecting the circuit to be detected coupled to the amplifier circuit 11 in accordance with an embodiment of the present disclosure. As shown in FIG. 5, for detecting the noise level of the circuit to be detected, the input terminal IN11 is coupled to the circuit to be detected. With such configurations, the input signal IN is the noise of the circuit to be detected and the noise of the OTA 111.

Those skilled in the art should readily understand, when there are a plurality of circuits to be detected, the noise detecting system 1 can further include a switching circuit including a plurality of corresponding switches, wherein each switch is coupled between a circuit to be detected and the input terminal IN11. By activating the corresponding switch, the noise detecting system 1 can detect different circuit's noise level. The detailed architecture of the switching circuit is omitted here for brevity.

Figure 6:
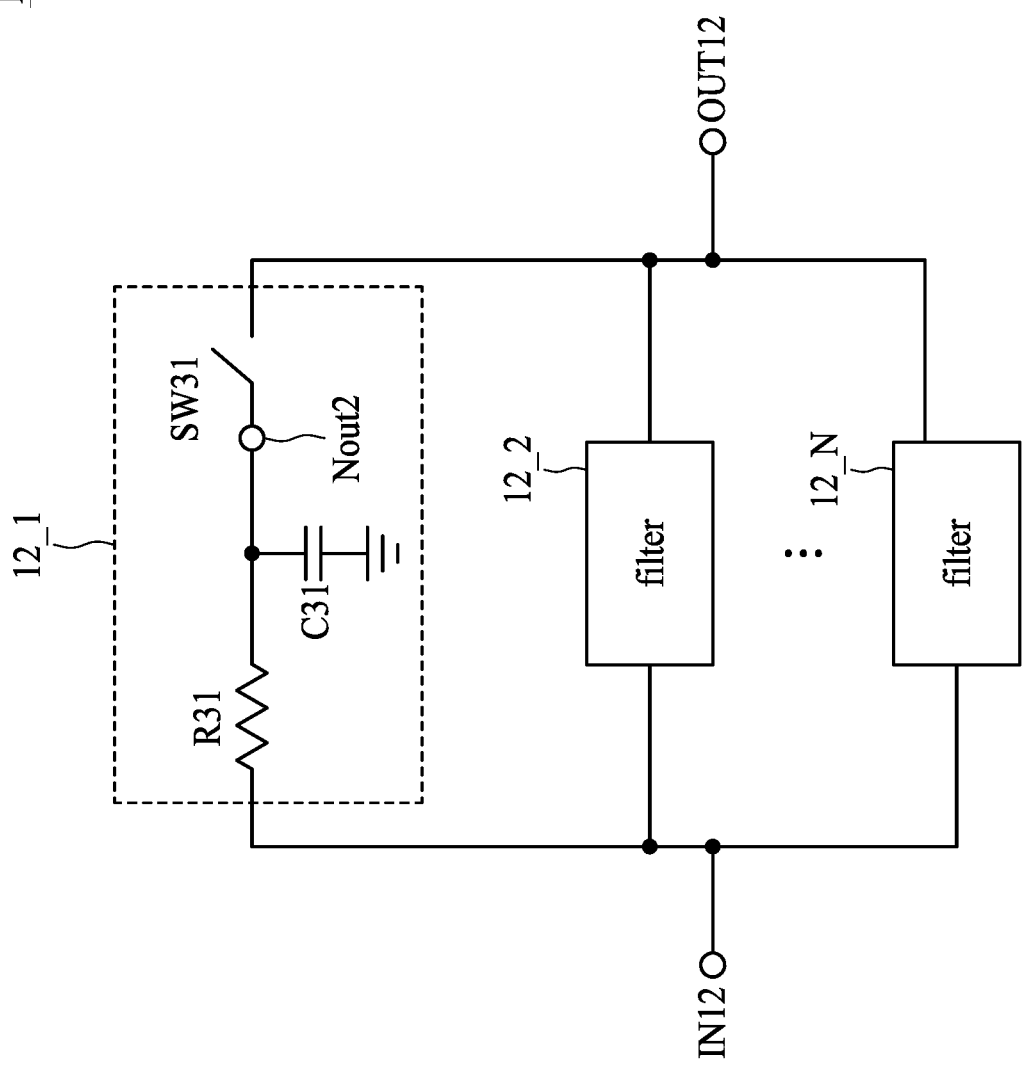
FIG. 6 is a diagram illustrating a filtering circuit in accordance with an embodiment of the present disclosure.

FIG. 6 is a diagram illustrating the filtering circuit 12 in accordance with an embodiment of the present disclosure. In some embodiments of the present disclosure, the filtering circuit 12 includes an input terminal IN12, an output terminal OUT12, and filters 12_1, 12_2, ..., and 12_N, wherein N is a natural number. In some embodiments of the present disclosure, the filters 12_1, 12_2, ..., and 12_N are coupled between the input terminal IN12 and the output terminal OUT12. In some embodiments of the present disclosure, the input terminal IN12 is coupled to the amplifier circuit 11, and the output terminal OUT12 is coupled to the comparing circuit 13. The filter circuit 12 is arranged to receive the amplified signal AS, and output the filtered signal FS by filtering the amplified signal AS.

In FIG. 6, the filter 12_1 is shown for example to elaborate the detailed architecture. In some embodiments of the present disclosure, the filter 12_1 includes a sub-output terminal Nout2, a resistor R31, a capacitor C31 and a switch SW31. In some embodiments of the present disclosure, a terminal of the resistor R31 is coupled to the input terminal IN12 and another terminal of the resistor R31 is coupled to the sub-output terminal Nout2. In some embodiments of the present disclosure, a terminal of the capacitor C31 is coupled to the sub-output terminal Nout2 and another terminal of the capacitor C31 is coupled to the ground. In some embodiments of the present disclosure, a terminal of the switch SW31 is coupled to the sub-output terminal Nout2 and another terminal of the switch SW31 is coupled to the output terminal OUT12. The switch SW31 is arranged to selectively couple the sub-output terminal Nout2 to the output terminal IN12. Those skilled in the art should understand the filter 12_2 to 12_N can also be implemented by the architecture shown in FIG. 6.

The resistor R31 and the capacitor C31 constitute a $1^{st}$ order low pass filter. The corner frequency f0 of the filter 12_1 can be represented as:

$$f0=1/(2*pi*RC),$$

wherein R is the resistance of the resistor R31, and C is the capacitance of the capacitor C31. The corner frequency f0 means that the gain of the filter 12_1 is 20 dB decay after the corner frequency f0. Those skilled in the art should understand that the frequency response of the filter 12_1 can be transformed into a brick wall profile, wherein the brick wall frequency fx can be represented as:

$$fx=1/(4*R*C),$$

and brick wall frequency fx means that for any signal/noise received by the filter 12_1, the signal/noise will be considered zero if the frequency of the signal/noise is greater than the brick wall frequency fx, which is better for the designer to estimate the actual magnitude of the signal/noise than the corner frequency f0. Those skilled in the art should understand the brick wall frequency fx can be considered as the bandwidth of the filter.

In some embodiments of the present disclosure, the filter 12_1 to 12_N are designed to have different bandwidth (i.e., different brick wall frequency fx). By coupling the filters 12_1 to 12_N with the switch SW31 therein to the comparing circuit 13 sequentially, the comparing circuit 13 can thus output N samples of the output signal OS, which facilitates the estimate of the noise level of the circuit to be detected for the designer. The estimate of the noise level of the circuit to be detected will be discussed later.

Due to the process deviation, the actual resistance of the resistor R31 and the actual capacitance of the capacitor C31 might be different from the simulation, and the deviation affects the actual brick wall frequency and also the accuracy of the estimation. Therefore, in some embodiments of the present disclosure, the noise detecting system 1 can further include a calibration mechanism for calibrating the bandwidth composed by the resistor R31 and the capacitor C31 for each filter.

Figure 7:
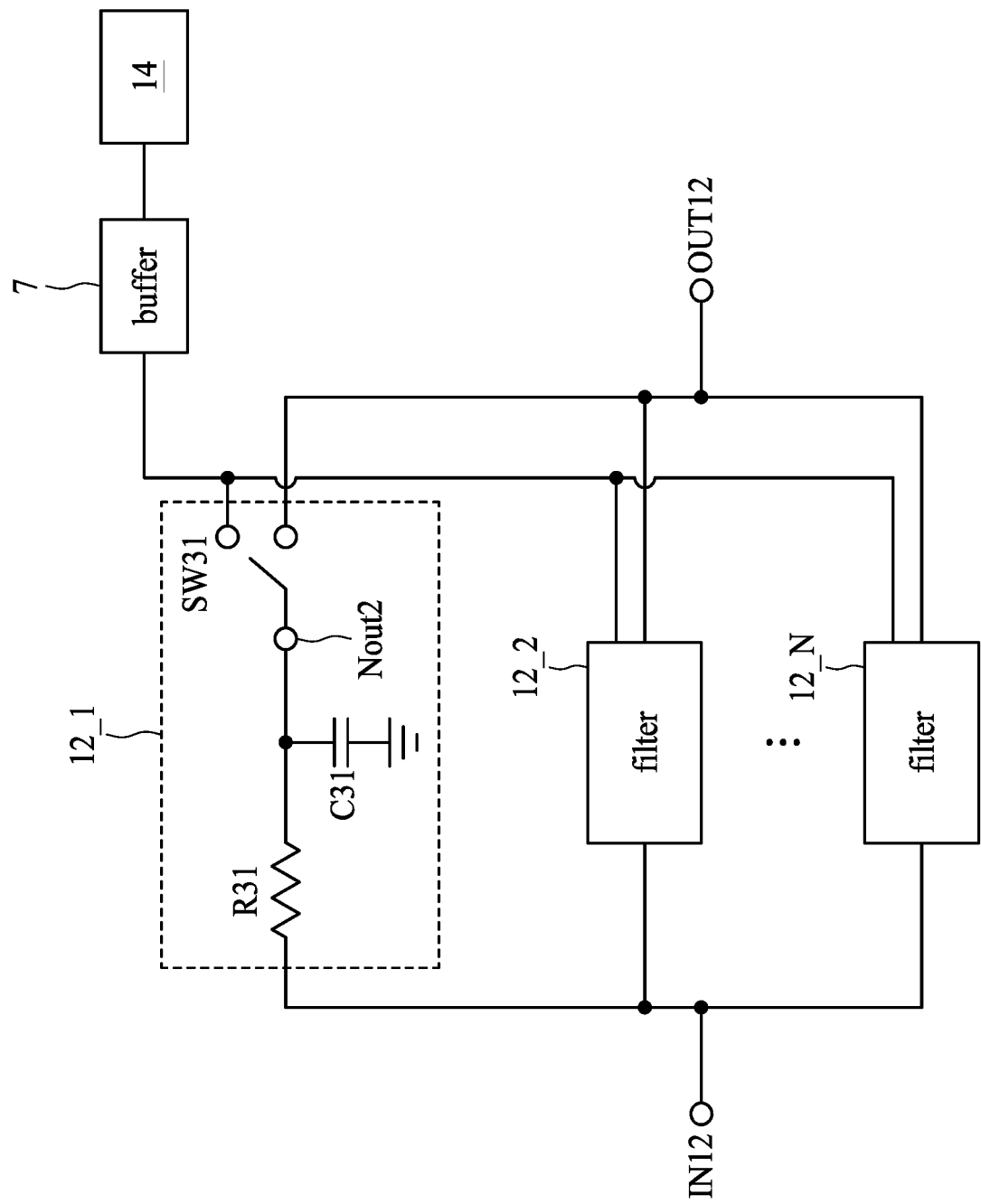
FIG. 7 is a diagram illustrating a calibration mechanism for a resistor and a capacitor in accordance with an embodiment of the present disclosure.

FIG. 7 is a diagram illustrating the calibration mechanism for the resistor R31 and the capacitor C31 in accordance with an embodiment of the present disclosure. In some embodiments of the present disclosure, the noise detecting system 1 further includes a buffer 7 coupled between the switch SW31 of each filter and the analyze device 14. When the filter 12_1 is tested, for example, the switch SW31 of the filter 12_1 is switched to the buffer 7. By inputting a signal, which the magnitude and the frequency are known, into the input terminal IN12 and observing the frequency response shown on the analyze device 14, the actual resistance of the resistor R31 and the actual capacitance of the capacitor C31 of the filter 12_1 can be deduced. Therefore, the actual bandwidth of the filter 12_1 can be learned.

Figure 8:
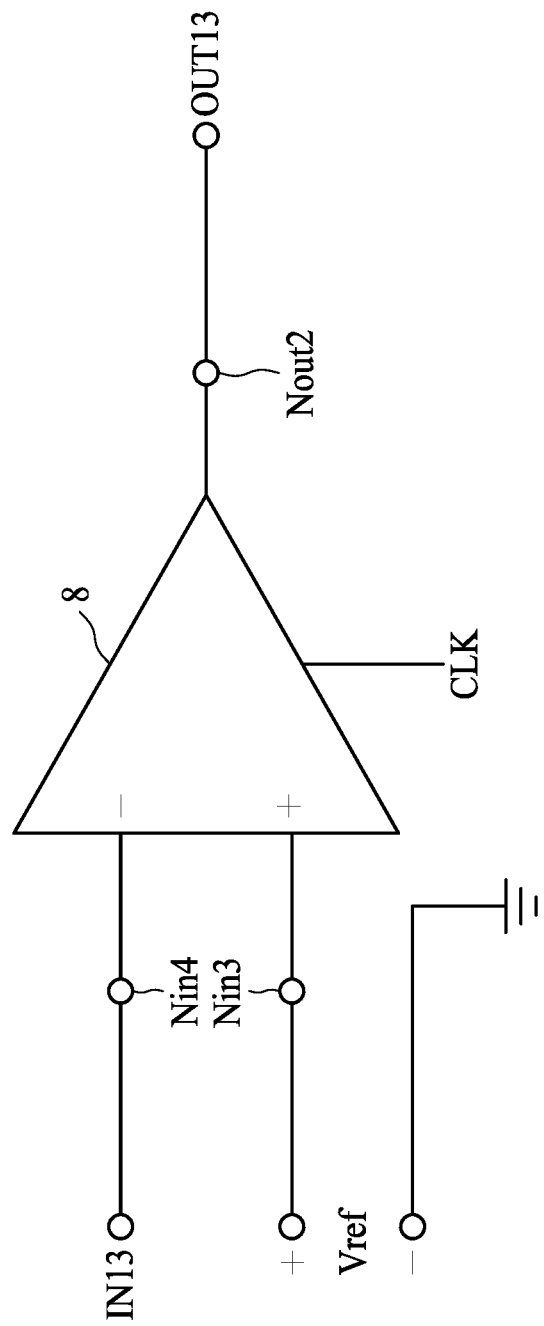
FIG. 8 is a diagram illustrating a comparing circuit in accordance with an embodiment of the present disclosure.

FIG. 8 is a diagram illustrating the comparing circuit 13 in accordance with an embodiment of the present disclosure. In some embodiments of the present disclosure, the comparing circuit 13 includes an input terminal IN13, an output terminal OUT13, and a comparator 8. In some embodiments of the present disclosure, the input terminal IN13 is coupled to the filtering circuit 12. In some embodiments of the present disclosure, the output terminal OUT13 is coupled to the output pad P1. The comparator 8 is arranged to compare the filtered signal FS to the reference voltage Vref, and output the output signal OS.

In some embodiments of the present disclosure, the comparator 8 includes input terminals Nin3 and Nin4, and an output terminal Nout2. In some embodiments of the present disclosure, the input terminal Nin3 is coupled to the reference voltage Vref. In some embodiments of the present disclosure, Nin4 is coupled to the input terminal IN13 to receive the filtered signal FS. In some embodiments of the present disclosure, the output terminal Nout2 is coupled to the output terminal OUT13.

After being compared to the reference voltage Vref, the output signal OS has either a high voltage (i.e., a logic high value '1') or a low voltage (i.e., logic low value '0'). However, in other embodiments of the present disclosure, the comparing circuit 13 can further includes a voltage-tocurrent converter, which is arranged to convert the output signal OS from the voltage form into a current form.

Figure 9:
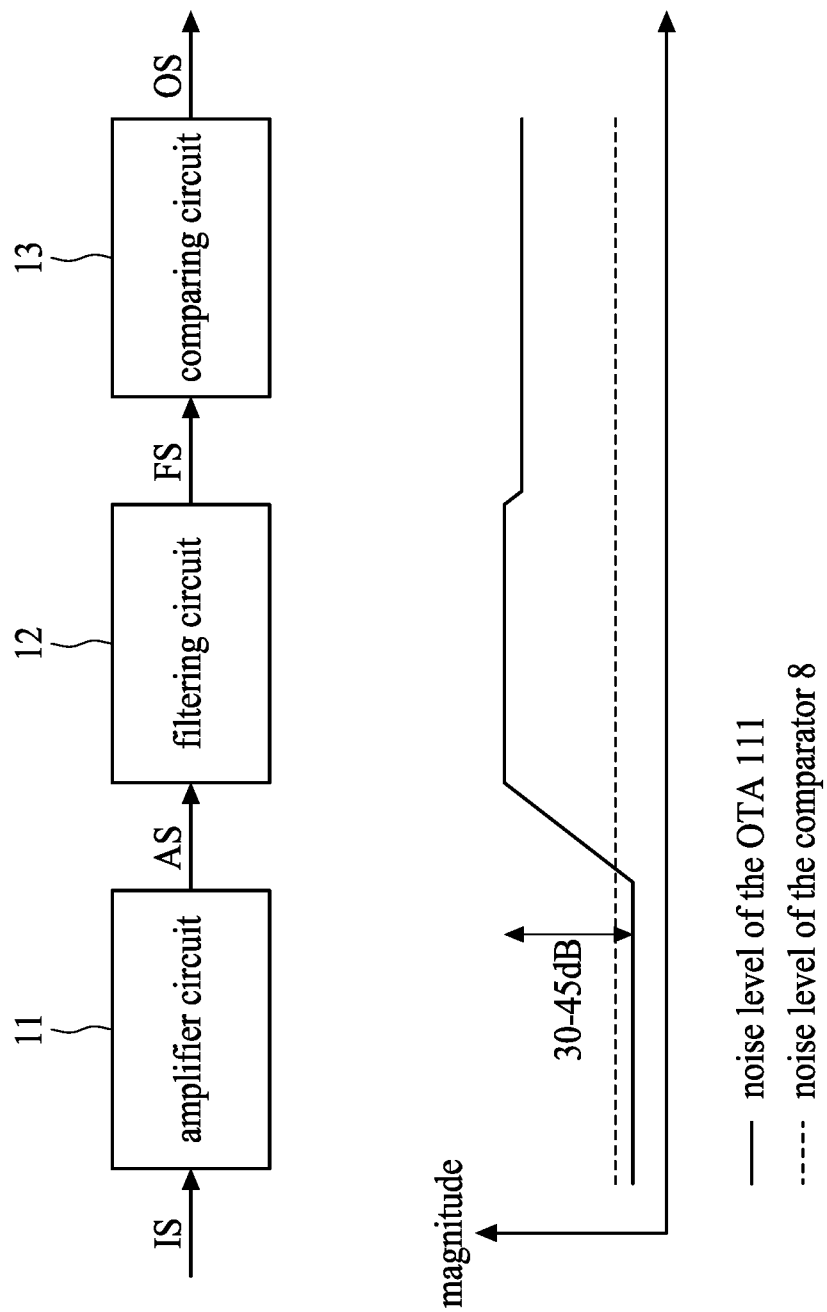
FIG. 9 is a diagram illustrating the noise after each circuit in a noise detecting circuit in accordance with an embodiment of the present disclosure.

FIG. 9 is a diagram illustrating the noise after each circuit in the noise detecting circuit 10 in accordance with an embodiment of the present disclosure. In the embodiment of FIG. 9, the noise detecting system 1 is configured to detect the noise level of the OTA 111, and the input signal IN is the noise of the OTA 111, which is mostly from the input pair.

After the amplifier circuit 11, the noise of the OTA 111 is amplified by the gain of the amplifier circuit 11, and outputted as the amplified signal AS, wherein the gain of the amplifier circuit 11 is determined by R113/R112. In some embodiments of the present disclosure, the gain determined by R113/R112 is about 30 dB to 45 dB. After the filtering circuit 12, the noise of the OTA 111 as the filtered signal FS has 0.1 to 0.2 dB loss due to the passive elements in the filtering circuit 12. In some embodiments of the present disclosure, the bandwidth of each of the filters 12_1 to 12_N in the filtering circuit 12 is designed to be greater than the frequency of the noise of the OTA 111 to prevent the noise of the OTA 111 from being filtered by the filtering circuit 12.

After the comparing circuit 13, the noise of the OTA 111 is compared to the reference voltage Vref and outputted as the output signal OS. Because the noise of the OTA 111 is amplified by the amplified circuit 11, the noise level is thus much greater than the noise of the comparator 8. Therefore, the noise of the comparator 8 does not affect the estimation of the noise level of the OTA 11.

Figure 10:
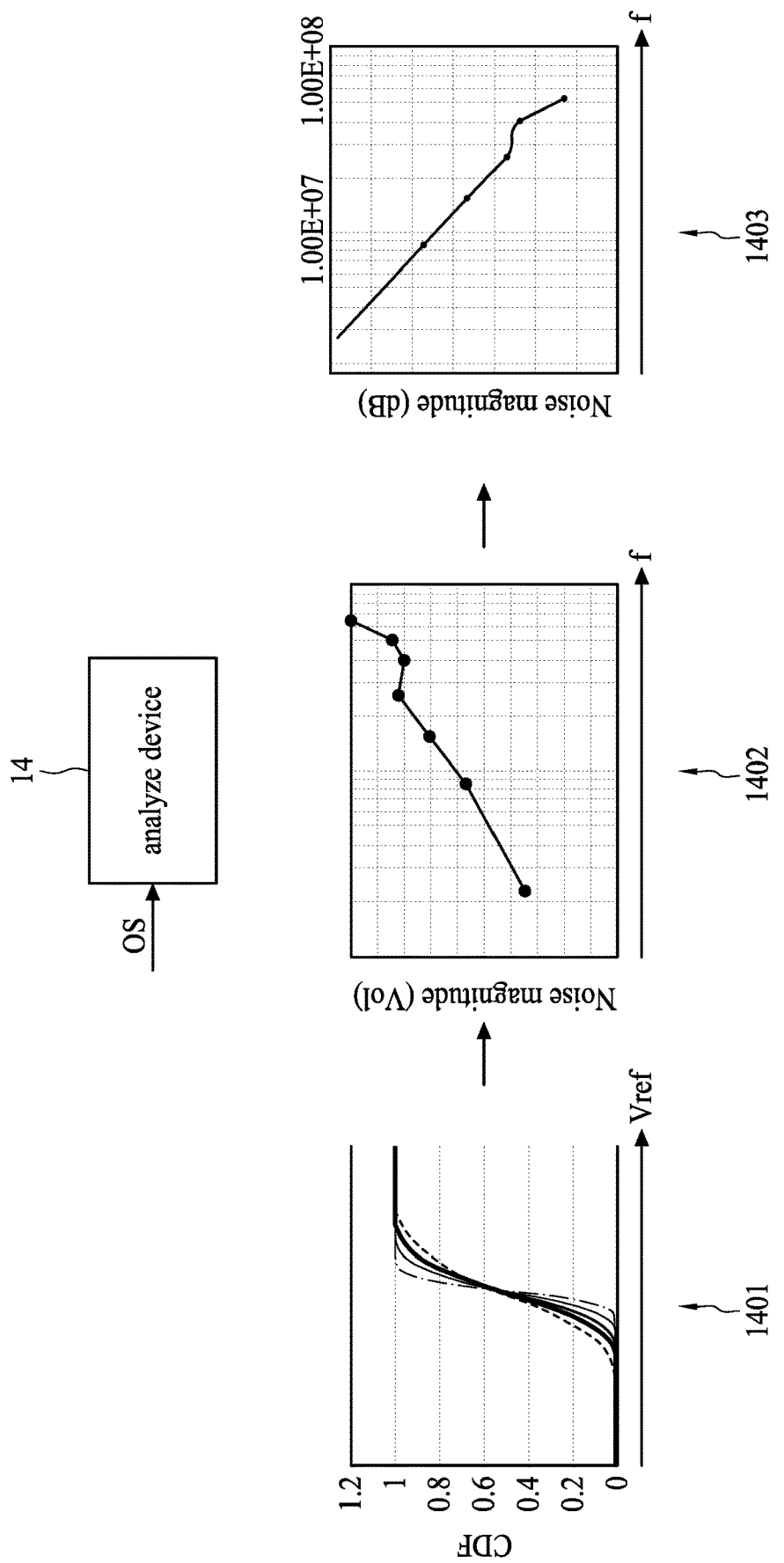
FIG. 10 is a diagram illustrating operations of an analyze device in accordance with an embodiment of the present disclosure.

FIG. 10 is a diagram illustrating operations of the analyze device 14 in accordance with an embodiment of the present disclosure. In operation 1401, the analyze device 14 collects the logic values of the output signal OS in a predetermined time period in response to the reference voltage Vref, and generates a CDF chart accordingly. As mentioned above, the filtering circuit 12 includes N filters 12_1 to 12_N having different bandwidth. Therefore, by sequentially coupling the filters 12_1 to 12_N to the comparing circuit 13, the analyze device 14 generates N CDF charts corresponding to N bandwidth.

For example, when the filter 12_1 is coupled to the comparing circuit 13 and the reference voltage Vref is set, the output signal OS indicating the noise level of the OTA 111 is compared to the reference voltage Vref in response to the bandwidth of the filter 12_1. After being compared to the reference voltage Vref, the noise of the OTA 111 as the output signal OS is either logic high value '1' or logic low value '0'. Therefore, in a predetermined time period, the analyze device 14 collects those logic values of the output signal OS, and calculates the possibility of the output signal OS being logic high value '1' (or logic low value '0') in the predetermined time period. Next, the analyze device 14 adjusts the reference voltage Vref, and calculates the possibility of the output signal OS being logic high value '1' (or logic low value '0') again. By sweeping the reference voltage Vref, the analyze device 14 generates a CDF chart of the output signal OS in response to the reference voltage Vref and the bandwidth of the filter 12_1. Next, the filter 12_2 is coupled to the comparing circuit 13, and the operation is executed again, and so on. Accordingly, N CDF charts of the output signal OS are generated.

In operation 1402, with the CDF charts of the output signal OS, the analyze device 14 can derive the voltages, which indicate the noise level of the OTA 111, in response to the different bandwidth of the filter 12_1 to 12_N. With the line chart obtained in the operation 1402, the designer can learn the noise level of the OTA 111, and also compare the testing results to the simulation results. In operation 1403, the analyze device 14 transforms the voltages into dB, and another line chart is obtained. By this, the slope of the flicker noise of the OTA 111 can be learned from the slope of the line chart.

Figure 11:
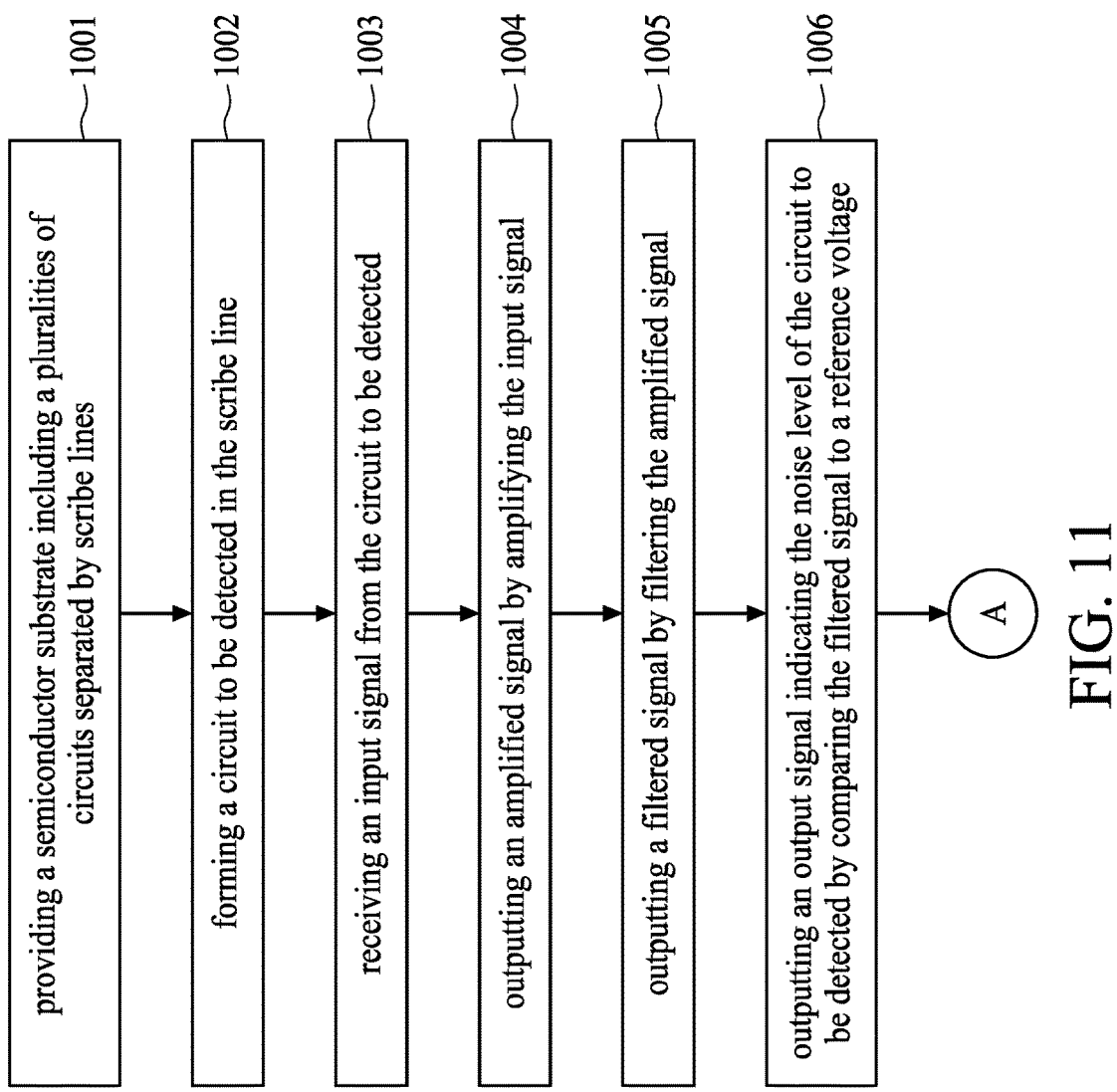
FIG. 11 is a flowchart illustrating a first part of a noise detecting method in accordance with an embodiment of the present disclosure.

FIG. 11 is a flowchart illustrating a first part of a noise detecting method 100 in accordance with an embodiment of the present disclosure. Provided that the results are substantially the same, the operations shown in FIG. 11 are not required to be executed in the exact order. The first part of the method 100 is summarized as follows:

In operation 1001, a semiconductor substrate is provided. In some embodiments of the present disclosure, a plurality of circuits constituting a plurality of dies are formed on the semiconductor substrate, and separated by scribe lines thereon. In operation 1002, a circuit to be detected is formed in the scribe line. In some embodiments of the present disclosure, the circuit to be detected can be a phase lock loop (PLL), a MOS, a bandgap, or an OTA. In operation 1003, an input signal from the circuit to be detected is received, wherein the input signal indicates a noise level of the circuit to be detected.

In operation 1004, an amplified signal is outputted by amplifying the input signal. In some embodiments of the present disclosure, the input signal is received by an amplifier circuit (e.g., the amplifier circuit 11). In some embodiments of the present disclosure, the amplifier circuit includes an OTA (e.g., the OTA 111). In some embodiments of the present disclosure, the amplifier circuit amplifies the input signal by a predetermined gain (e.g., the gain decided by R113/R112). In some embodiments of the present disclosure, when the circuit to be detected is the OTA, an input terminal (e.g., the input terminal IN11) of the amplifier circuit is coupled to a capacitor or a LDO as a DC block foe stabling the AC ground, and the input signal is the noise of the OTA. In some embodiments of the present disclosure, when the circuit to be detected is other circuits than the OTA, the input terminal (e.g., the input terminal IN11) of the amplifier circuit is coupled to the circuit to be detected, and the input signal is the noise of the circuit to be detected and the noise of the OTA.

In operation 1005, a filtered signal is outputted by filtering the amplified signal. In some embodiments of the present disclosure, the amplified signal is received by a filtering circuit (e.g., the filtering circuit 12). In some embodiments of the present disclosure, the filtering circuit includes a plurality of filters having different bandwidth. In some embodiments of the present disclosure, the bandwidth of the plurality of filters is greater than the frequency of the noise of the circuit to be detected. In some embodiments of the present disclosure, each filter included in the filtering circuit includes a $1^{st}$ RC filter, and the bandwidth of the filter can be represented as $\frac{1}{4}*R*C$.

In operation 1006, an output signal indicating the noise level of the circuit to be detected is outputted by comparing the filtered signal to a reference voltage. In some embodiments of the present disclosure, the filtered signal is received by a comparing circuit (e.g., the comparing circuit 13). In some embodiments of the present disclosure, the comparing circuit includes a comparator (e.g., the comparator 8). In some embodiments of the present disclosure, the comparator compares the filtered signal to a reference voltage. In some embodiments of the present disclosure, the output signal has either logic high value '1' or logic low value '0'.

Figure 12:
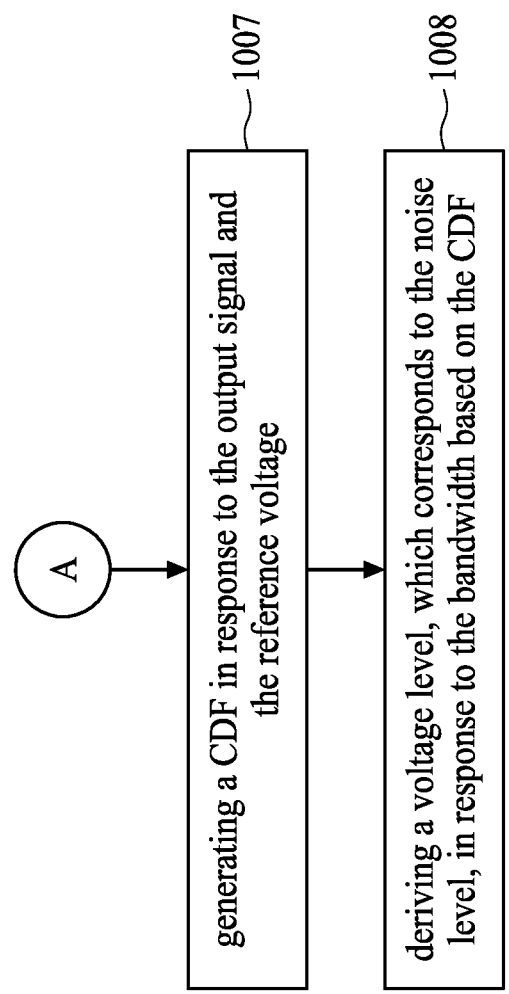
FIG. 12 is a flowchart illustrating a second part of a noise detecting method in accordance with an embodiment of the present disclosure.

FIG. 12 is a flowchart illustrating a second part of the noise detecting method 100 in accordance with an embodiment of the present disclosure. Provided that the results are substantially the same, the operations shown in FIG. 12 are not required to be executed in the exact order. The second part of the method 100 is summarized as follows:

In operation 1007, a CDF in response to the output signal and the reference voltage is generated. In some embodiments of the present disclosure, the output signal is received by an analyze device (e.g., the analyze device 14). In some embodiments of the present disclosure, when the filter is coupled to the comparing circuit and the reference voltage is set, the analyze device 14 collects the logic values of the output signal, and calculates the possibility of the output signal being logic high value '1' (or logic low value '0'). In some embodiments of the present disclosure, the analyze device 14 next adjusts the reference voltage, and calculates the possibility of the output signal being logic high value '1' (or logic low value '0') again. By sweeping the reference voltage, the analyze device generate a CDF in response to the reference voltage and the bandwidth of the filter.

In operation 1008, a voltage level, which corresponds to the noise level, in response to the bandwidth based on the CDF is derived.

According to an embodiment of the present disclosure, a noise detecting circuit is disclosed. The noise detecting circuit includes an amplifier circuit, arranged to amplify an input signal indicating a noise level of a circuit to be detected and output an amplified signal; a filtering circuit, arranged to receive and filter the amplified signal and output a filtered signal; and a comparing circuit, arranged to receive and compare the filtered signal to a reference voltage and output an output signal; wherein the filtering circuit includes: an output terminal; and a first filter, selectively coupled to the output terminal, including: a sub-output terminal; a switch, arranged to selectively couple the sub-output terminal to the output terminal; a resistor, wherein a terminal of the resistor is coupled to the amplifier circuit and another terminal of the resistor is coupled to the sub-output terminal; and a capacitor, wherein a terminal of the capacitor is coupled to the sub-output terminal and another terminal of the capacitor is coupled to a reference voltage source.

According to an embodiment of the present disclosure, a noise detecting system is disclosed. The noise detecting system, including: an amplifier circuit, arranged to amplify an input signal indicating a noise level of a circuit to be detected and output an amplified signal; a filtering circuit, arranged to receive and filter the amplified signal and output a filtered signal; a comparing circuit, arranged to receive and compare the filtered signal to a reference voltage and output an output signal; and an analyze device, coupled to the comparing circuit via a first output pad and arranged to generate a CDF in response to the output signal and the reference voltage; a switching circuit, including a plurality of switches; wherein the filtering circuit includes: a plurality of filters, wherein each filter has different corner frequency and a corresponding switch for selectively coupling the filter to the comparing circuit.

According to an embodiment of the present disclosure, a noise detecting method is disclosed. The noise detecting method, including: receiving an input signal from a circuit to be detected; outputting an amplified signal by amplifying the input signal; outputting a filtered signal by filtering the amplified signal by a filter having a bandwidth; and outputting an output signal indicating a noise level of the circuit to be detected by comparing the filtered signal to a reference voltage; generating a CDF in response to the output signal and the reference voltage; and deriving a voltage level, which corresponds to the noise level, in response to the bandwidth based on the CDF; wherein the filter includes: an output terminal; a first filter, selectively coupled to the output terminal, including: a sub-output terminal; a switch, arranged to selectively couple the sub-output terminal to the output terminal; a resistor, coupled to the sub-output terminal; and a capacitor, wherein a terminal of the capacitor is coupled to the sub-output terminal and another terminal of the capacitor is coupled to a reference voltage source.

What is claimed is:

1. A noise detecting circuit, comprising:
   an amplifier circuit, arranged to amplify an input signal indicating a noise level of a circuit to be detected and output an amplified signal;
   a filtering circuit, arranged to receive and filter the amplified signal and output a filtered signal; and
   a comparing circuit, arranged to receive and compare the filtered signal to a reference voltage and output an output signal;
   wherein the filtering circuit comprises:
   an output terminal; and
   a first filter, selectively coupled to the output terminal, comprising:
   a sub-output terminal;
   a switch, arranged to selectively couple the sub-output terminal to the output terminal;
   a resistor, wherein a terminal of the resistor is coupled to the amplifier circuit and another terminal of the resistor is coupled to the sub-output terminal; and
   a capacitor, wherein a terminal of the capacitor is coupled to the sub-output terminal and another terminal of the capacitor is coupled to a reference voltage source.

2. The noise detecting circuit of claim 1, wherein the input signal is received from the circuit to be detected.

3. The noise detecting circuit of claim 1, wherein the filtering circuit is coupled to the amplifier circuit, and the comparing circuit is coupled to the filtering circuit.

4. The noise detecting circuit of claim 1, wherein the amplifier circuit comprises:
   an output terminal;
   an operational transconductance amplifier (OTA), connected to the output terminal;
   a first resistor, coupled between the output terminal and an input terminal of the OTA; and
   a second resistor, coupled to the input terminal of the OTA;
   a capacitor, coupled between the second resistor and a reference voltage source.

5. The noise detecting circuit of claim 4, wherein the filtering circuit further comprises:
   a second filter, selectively coupled to the output terminal, wherein a corner frequency of the first filter and a corner frequency of the second filter are different.

6. The noise detecting circuit of claim 4, further comprising:
   a switching circuit, arranged to selectively couple the output terminal to the comparator.

7. The noise detecting circuit of claim 6, further comprising:
   a buffer, wherein the switching circuit is further arranged to selectively coupled the output terminal to the buffer.

8. The noise detecting circuit of claim 1, wherein the comparing circuit comprises:
   a comparator, arranged to compare the filtered signal to the reference voltage to output the output signal.

9. The noise detecting circuit of claim 8, wherein the comparing circuit comprises:

a voltage-to-current converter, coupled to the comparator and arranged to convert the output signal from a voltage form into a current form.

10. A noise detecting system, comprising:
an amplifier circuit, arranged to amplify an input signal indicating a noise level of a circuit to be detected and output an amplified signal;
a filtering circuit, arranged to receive and filter the amplified signal and output a filtered signal;
a comparing circuit, arranged to receive and compare the filtered signal to a reference voltage and output an output signal; and
an analyze device, coupled to the comparing circuit via a first output pad and arranged to generate a CDF in response to the output signal and the reference voltage;
a switching circuit, comprising a plurality of switches;
wherein the filtering circuit comprises:
a plurality of filters, wherein each filter has different corner frequency and a corresponding switch for selectively coupling the filter to the comparing circuit.

11. The noise detecting system of claim 10, wherein the amplifier circuit comprises:
an output terminal;
an operational transconductance amplifier (OTA), connected to the output terminal;
a first resistor, coupled between the output terminal and an input terminal of the OTA; and
a second resistor, coupled to the input terminal of the OTA;
wherein each switch is coupled between the circuit to be detected and the second resistor.

12. The noise detecting system of claim 10, wherein the comparing circuit comprises a comparator.

13. The noise detecting system of claim 10, wherein the analyze device is further arranged to display a voltage level, which corresponds to the noise level, in response to the corner frequency based on the CDF.

14. The noise detecting system of claim 10, further comprising:
a clock generator, coupled to the comparing circuit via a second output pad and arranged to provide a clock signal to the comparing circuit.

15. The noise detecting system of claim 11, wherein the amplifier circuit further comprises:
a capacitor, coupled between the second resistor and a reference voltage source.

16. The noise detecting system of claim 11, wherein the amplifier circuit further comprises:
a low dropout regulator (LDO), coupled between the second resistor and a reference voltage source.

17. The noise detecting system of claim 11, wherein one terminal of the second resistor is coupled to the circuit to be detected.

18. A noise detecting method, comprising:
receiving an input signal from a circuit to be detected;
outputting an amplified signal by amplifying the input signal;
outputting a filtered signal by filtering the amplified signal by a filter having a bandwidth; and
outputting an output signal indicating a noise level of the circuit to be detected by comparing the filtered signal to a reference voltage;
generating a CDF in response to the output signal and the reference voltage; and
deriving a voltage level, which corresponds to the noise level, in response to the bandwidth based on the CDF;
wherein the filter comprises:
an output terminal;
a first filter, selectively coupled to the output terminal, comprising:
a sub-output terminal;
a switch, arranged to selectively couple the sub-output terminal to the output terminal;
a resistor, coupled to the sub-output terminal; and
a capacitor, wherein a terminal of the capacitor is coupled to the sub-output terminal and another terminal of the capacitor is coupled to a reference voltage source.

19. The method of claim 18, wherein outputting the amplified signal by amplifying the input signal comprises:
utilizing an amplifier to amplify the input signal, wherein the amplifier comprises:
an output terminal;
an operational transconductance amplifier (OTA), connected to the output terminal;
a first resistor, wherein a terminal of the first resistor is coupled to the output terminal, and another terminal of the first resistor is coupled to an input terminal of the OTA; and
a second resistor, wherein a terminal of the second resistor is coupled to the input terminal of the OTA.

20. The method of claim 19, wherein outputting the output signal indicating the noise level of the circuit to be detected by comparing the filtered signal to the reference voltage comprises:
utilizing a comparing circuit to compare the filtered signal to the reference voltage, wherein the comparing circuit comprises:
a comparator, arranged to compare the filtered signal to the reference voltage to output the output signal.

* * * * *